(12) United States Patent
Duineveld et al.

(10) Patent No.: US 7,084,236 B2
(45) Date of Patent: Aug. 1, 2006

(54) POLYMER, METHOD OF ITS PREPARATION, AND ELECTRONIC DEVICE

(75) Inventors: Paulus Cornelis Duineveld, Eindhoven (NL); Margaretha Maria De Kok-Van Breemen, Eindhoven (NL); Priscilla Amber Majella Lips, Enschede (NL); Jochem Petrus Maria De Koning, Breda (NL); Cornelis Dirk Roelandse, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/478,894

(22) PCT Filed: May 27, 2002

(86) PCT No.: PCT/IB02/01880

§ 371 (c)(1),
(2), (4) Date: Nov. 24, 2003

(87) PCT Pub. No.: WO02/096970

PCT Pub. Date: Dec. 5, 2002

(65) Prior Publication Data

US 2004/0176566 A1 Sep. 9, 2004

(30) Foreign Application Priority Data

May 29, 2001 (EP) .................................. 01202029

(51) Int. Cl.
*C08G 61/00* (2006.01)
*C08G 61/12* (2006.01)

(52) U.S. Cl. ................. 528/397; 528/86; 528/373; 528/422; 528/425; 428/690; 428/917

(58) Field of Classification Search .................. 528/86, 528/373, 422, 425; 428/690, 917
See application file for complete search history.

(56) References Cited

U.S. PATENT DOCUMENTS 4,576,688 A * 3/1986 David .................... 204/157.62

FOREIGN PATENT DOCUMENTS

| DE | 3737948 | * | 6/1988 |
| EP | 0892028 | | 1/1999 |
| WO | WO9921936 | | 5/1999 |

OTHER PUBLICATIONS

PHN 17.755 EP-P; U.S. Appl. No. 09/890,364; filed Jul. 30, 2001.
T.R. Hubner, et al.; "Ink-jet printing of doped polymers for organic light emitting devices" American Institute of Physics; vol. 72, No. 5; Feb. 1998; pp. 519-521.

* cited by examiner

Primary Examiner—Duc Truong

(57) ABSTRACT

A polymer comprising structural units of the formula I has a number average molecular weight of less than $300.10^3$ g/mole and a weight average molecular weight of less than $500.10^3$ g/mole. A preferred example is a polyphenylenevinylene. A composition of this polymer can be deposited on a substrate by means of inkjet printing excellently. This can be used for the manufacture of electroluminescent devices, in particular multicolor electroluminescent devices

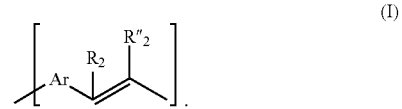

11 Claims, 1 Drawing Sheet

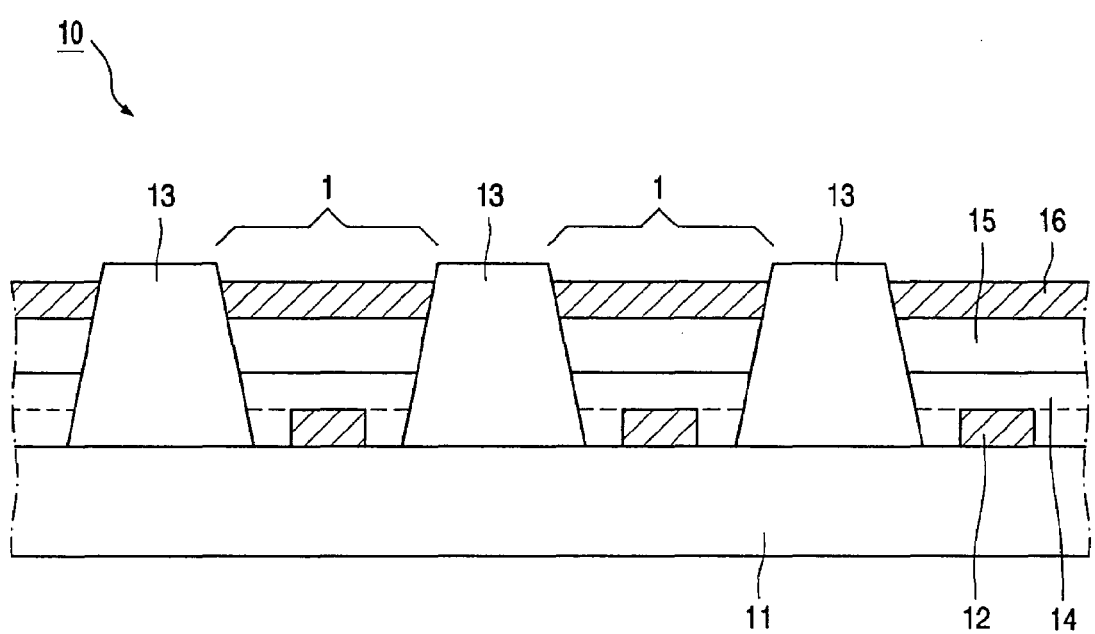

POLYMER, METHOD OF ITS PREPARATION, AND ELECTRONIC DEVICE

The invention relates to a polymer with structural units in accordance with formula I,

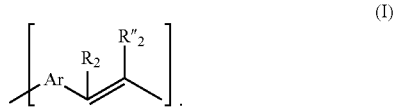

in which

Ar is an aromatic cyclic system with 4 to 20 carbon atoms with optionally a single or multiple substitution with a group chosen from a non-branched $C_1$–$C_{20}$-alkyl, $C_3$–$C_{20}$-alkoxy, $C_1$–$C_{20}$-alkylsulphate, a branched $C_3$–$C_{20}$-alkyl, phenyl, or benzyl group, and which may optionally comprise up to 4 hetero atoms chosen from the group comprising oxygen, sulfur, and nitrogen in the aromatic cyclic system, $R_2$ and $R''_2$ are chosen from the group comprising a hydrogen atom and a $C_1$–$C_{20}$-alkyl and a $C_4$–$C_{20}$-aryl group, which groups may optionally comprise substituents.

The invention further relates to a composition.

The invention further relates to a method of preparing polymers with structural units as defined by formula I, a composition of which polymers can be provided on a substrate by means of ink jet printing.

The invention also relates to the use of said composition.

The invention also relates to an electronic device.

Such a polymer is known from WO-A-99/21936. In the known polymer, the group

—Ar— is a multiply substituted phenyl group. The polymer is a polyphenylene-vinylene, which will also be referred to as PPV hereinafter. The polymer is prepared by a method which starts with a monomer of the formula Cl—$CH_2$—Ar—$CH_2$—Cl, in which Ar has the same meaning as in the formula I. After addition of a base, polymerization takes place to a polymer having structural units —Ar—CHCl—$CH_2$—. Then the Cl group is eliminated through heating. This method is known to those skilled in the art as the Gilch synthesis. The PPVs prepared in this manner have electroluminescent properties and are used in light-emitting diodes and picture screens for this reason. It is desirable in the manufacture of such picture screens to provide a layer of the PPVs by means of ink jet printing.

Experiments carried out by applicant have shown that a layer of PPVs of the formula I cannot be provided on a substrate by means of ink jet printing without special measures.

It is a first object of the invention to provide a polymer of the kind mentioned in the opening paragraph, a composition of which can be provided on a substrate by means of ink jet printing.

It is a second object of the invention to provide a composition of the kind mentioned above which can be provided on a substrate by means of ink jet printing.

It is a third object of the invention to provide a method of the kind mentioned above by means of which the polymer according to the invention can be prepared.

It is a fourth object of the invention to provide an electronic device of the kind mentioned above comprising the polymer of the invention.

The first object is achieved in that the polymer has a number average molecular weight which is below $300.10^3$ g/mole, and in that the polymer has a weight average molecular weight which is below $500.10^3$ g/mole. It was surprisingly found that compositions of the polymer according to the invention are well printable. Various problems, however, arise with compositions of the polymer having a higher number average molecular weight. It was found first of all that the head of the printing unit used for ink jet printing is clogged up very quickly and thus becomes useless. Secondly, a higher molecular weight is found to make the elongational viscosity so high that no droplets are formed during printing, but threads. This considerably slows down the printing. In addition, the risk of the polymer being deposited in an undesirable location on the substrate is considerably increased by the formation of threads. Thirdly, a layer of the polymer of a non-uniform thickness is often obtained. The result of this is that the device will not meet the relevant specifications.

The inventors have observed that the invention is of particular importance for conjugated polymers with a—conjugated—chain of alternating single and double bonds which are delocalized. According to the theory of organic chemistry, double bonds exist as a result of overlapping p-orbitals. The result of this is that a double bond lies in a flat plane and has a strongly reduced flexibility. According to a model from the dynamics of polymeric liquids—the reptation model—, diffusion in a polymeric liquid takes place mainly in a one-dimensional manner in the direction of the chain. Owing to the smaller flexibility of the conjugated chain and—probably—more densely packed polymer chains, the diffusion of the conjugated chain is thus less than that of the non-conjugated chain. It is by no means surprising for these reasons that other polymers such as polyvinylcarbazoles, and diluted solutions of precursor polymers known from EP-A-892028 behave differently. Indeed, the compositions known from EP-A-892028 with 0.75% by weight of precursor polymer, a usual concentration, are even found to be not or badly printable by means of ink jet printing.

The polymer according to the invention preferably is a PPV. Examples thereof preferably comprise as the —Ar-group an aromatic group chosen from: 1,4-phenylene, 2,6-naphthalenediyl, 1,4-naphthalenediyl, 1,4-anthracenediyl, 2,6-anthracenediyl, 9,10-anthracenediyl, 2,5-thienylene, 2,5-furanediyl, 2,5-pyrrolediyl, 1,3,4-oxadiazole-2,5-diyl, 1,3,4-thiadiazole-2,5-diyl, 2,5-benzo[c]-furanediyl, 2,5-benzo[c]-pyrrolediyl, 2,5-benzo[c]thienylene, thieno[3,2-b]thiofene-2,5-diyl, pyrrolo[3,2-b]pyrrole-2,5-diyl, pyrene-2,7-diyl, 4,5,9,10-tetrahydropyrene-2,7-diyl, 4,4'-biphenylene, phenantrene-2,7-diyl, 9,10-dihydrophenantrene-2,7-diyl, dibenzofurane-2,7-diyl, dibenzothiophene-2,7-diyl, carbazole-2,7-diyl, of which the nitrogen-containing groups may be substituted on the nitrogen atom with a $C_1$–$C_{22}$-alkyl or $C_2$–$C_{10}$-aryl group, while in all said groups the H atoms in the aromatic rings may be substituted by a $C_1$–$C_{22}$ linear or branched alkyl group, $C_4$–$C_{14}$-aryl group, electron-donating groups such as $C_1$–$C_{22}$ linear or branched alkoxy and alkylthio groups, and halogen atoms, or electron-attracting groups such as cyano, nitro, and ester groups, while the $C_1$–$C_{1-4}$-aryl group itself may be substituted by electron-donating or electron-attracting groups.

By further preference, the —Ar group is an aryl-1,4-phenylene group, in which the aryl group is a phenyl, naphtyl, or biphenylyl group which may or may not be substituted. In particular, the —Ar group is present in a copolymer, such as the copolymers of formula (1) and (2), in which $OC_{10}$ represents 3,7-dimethyloctyloxy, $OC_4$ represents 2-methylpropoxy, and $0 \leq r \leq 1$, r being preferably approximately equal to 0.5:

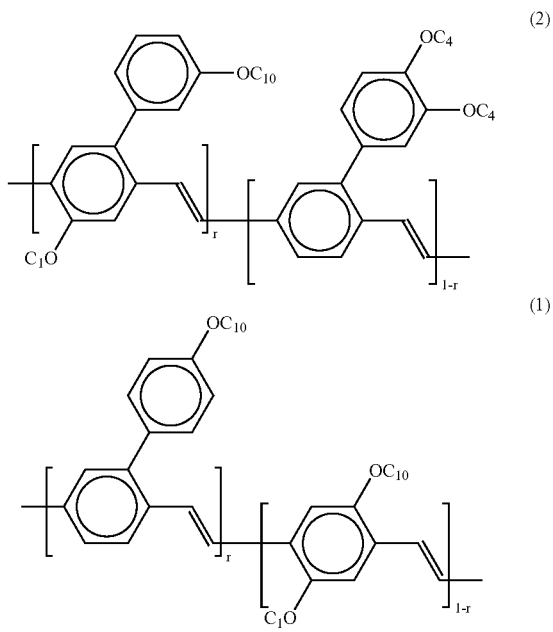

The polymer may alternatively be, for example, a poly-thienylene-vinylene, which polymer is used as an organic semiconductor in thin-film transistors. These and similar polymers comprise the unit of formula IV chosen as their aromatic group —Ar—,

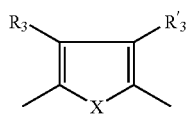

in which
X is chosen from the group comprising O, S, $NR_6$, $R_3$ and $R_{13}$ may possibly be identical and are chosen from the group comprising the atoms of hydrogen, chlorine, bromine, fluorine, and iodine, and the $C_1$–$C_4$-alkyl, carbonitryl, trihalomethyl, hydroxy, nitro, amino, carboxyl, sulphoxyl, sulphonate, and carbonate groups, and substituted and non-substituted phenyl, alkylaryl and arylalkyl, alkoxy, and thioalkoxy groups, and $R_6$ is chosen from the group comprising a hydrogen atom and a $C_1$–$C_{20}$-alkyl, aryl, $C_1$–$C_{20}$-alkylaryl, and arylalkyl group.

The polymer according to the invention with a number average molecular weight of below $300.10^3$ g/mole may be obtained inter alia through the preparation of the polymer of formula I from a polymer of the formula II, in which Z is equal to a halogen chosen from among F, Cl, Br, and I; whereupon an ultrasonic aftertreatment takes place of a composition comprising the prepared polymer and a solvent.

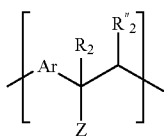

It was found that the aftertreatment provides a decrease of the average molecular weight. The inventors suspect, without wishing to be bound by this supposition, that aggregates are destroyed and/or crosslinks between chains are removed in the aftertreatment. The ultrasonic aftertreatment provides not only a decrease in the average molecular weight, but also a narrower molecular weight distribution. A composition comprising the polymer is found to be stable after the aftertreatment. It was further found that the ultrasonic aftertreatment has no adverse effect on the operation of an electronic device in which a layer of the polymer, in particular of the PPV, is used. The aftertreatment preferably lasts 10 to 20 minutes and is carried out at 0 to 30° C. Preferably, Z is identical to Cl.

It is alternatively possible to obtain the polymer according to the invention by a different synthesis route such as described in applicant's application no. EP 00201911.5 (PHNL000311) not previously published.

The polymer is made into a composition also comprising a solvent so as to be provided as a layer on a substrate. It was found that the composition according to the invention does not suffer a strongly increased elongational viscosity. The composition behaves as a Newtonian liquid during printing. Furthermore, the composition preferably comprises usual auxiliary substances such as wetting agents like glycerin and diethylene-glycol. It is also possible to use a mixture of solvents. The composition may advantageously be made available in a reservoir of an ink jet printer.

Preferably, the composition comprises between 0.5 and 2.0% by weight of the polymer, said polymer having a number average molecular weight of between $75.10^3$ and $300.10^3$ g/mole, and a weight average molecular weight of between $150.10^3$ and $500.10^3$. Experiments have shown that such a composition has a reasonable to good printing quality. If the polymer is a PPV, the printed layer is found to be suitable for use as an electroluminescent layer in an electroluminescent device. By further preference, the composition comprises 1.0 to 1.5% by weight of the polymer, said polymer having a number average molecular weight of between $75.10^3$ and $225.10^3$ g/mole, and a weight average molecular weight of between $150.10^3$ and $450.10^3$. Such a composition has a good printing quality. The electroluminescent device manufactured therewith provides a luminescence which complies with the requirements set.

The object of providing an electronic device is achieved in the device according to claim 9. This device is especially characterized in that the polymer has a number average molecular weight below $300.10^3$ g/mole. It is possible because of this comparatively low molecular weight to provide the layer of the polymer by means of ink jet printing. The layer can be provided in a desired pattern in this manner. It is possible, moreover, to provide several patterns next to one another on the substrate. An electroluminescent device with more than one color can be obtained in this manner. For example, a first pattern comprises a PPV which emits yellow light; a second pattern comprises a PPV which emits green light, and a third pattern comprises a PPV which emits red light. Such PPVs are known per se. It is furthermore possible for a first pattern to comprise a PPV, while a second pattern comprises a different electroluminescent material, such as a polyfluorine. Such polyfluorines are also known per se.

These and other aspects of the polymers, the composition, the method, and the electronic device according to the invention will be explained in more detail below with reference to a Figure, a Table, and a description of the Figures, in which:

Table 1 lists the printing properties of compositions according to the invention, and FIG. 1 is a diagrammatic cross-sectional view of a first embodiment of the electronic device.

EMBODIMENT 1

A polymer of the formula (1) in which —$OC_{10}$ represents 3,7-dimethyloctyloxy, and r is 0.5, is prepared by a method comparable to the method known from WO99/21936. This polymer will also be referred to hereinafter as NRS—PPV.

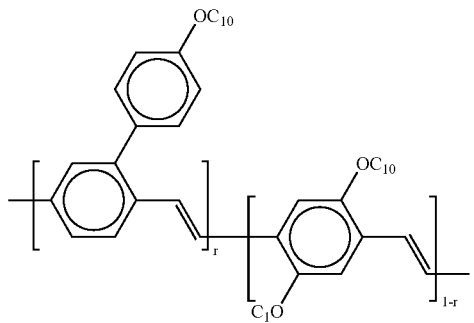

(1)

The NRS—PPV has a number average molecular weight $M_a$ of approximately $9.10^5$ g/mole, and a weight average molecular weight $M_w$ of approximately $2.10^6$ g/mole. It is used in a 1.2% by weight solution in toluene. This is found to be not printable. A vessel containing the solution is placed in an ultrasonic device which is commercially available under the designation Bransonic B32 for an aftertreatment at room temperature. The aftertreatment is carried out during a period of 4 hours. The treatment is interrupted every hour for determining the molecular weight. After two hours, $M_n$ is $3.9.10^5$ g/mole and $M_w$ is $8.9.10^5$ g/mole. The solution is found to be somewhat printable. After four hours, $M_n$ has become $2.3.10^3$ g/mole and $M_w$ $6.0.10^3$ g/mole. The solution is found to be reasonably printable. This treatment is indicated in Table 1 as "soft US", accompanied by the duration of the treatment.

EMBODIMENT 2

A vessel with an untreated solution of NRS—PPV in anisole was placed in an ice bath. The solution, no. 25 in Table 1, had an Mn value of $4.5.10^5$ g/mole and an $M_w$ value of $5.3.10^5$ g/mole. This solution was first subjected to a soft US treatment for seven hours. Then a rod system was added to the vessel for an ultrasonic treatment. The rod system was a Branson Sonifier 450. The solution was subjected to an ultrasonic treatment at a power of 280 W for 13 hours. The treatment was carried out in a pulsatory manner, ultrasonic vibrations being generated during 60% of the time. Afterwards the number average molecular weight and the weight average molecular weight were determined. The results were: $M_n=170.10^3$ g/mole, $M_w=110.10^3$ g/mole, and the solution was well printable. This treatment was denoted "harsh US" in Table 1, with the treatment duration in hours.

EMBODIMENT 3

An ink reservoir of an ink jet printer was filled with a composition of a PPV treated in accordance with embodiment 1, approximately 1% by weight of PPV being present. The ink reservoir was placed in an ink jet printer with a single-nozzle piezoelectric ink jet head with a nozzle diameter of 50 μm (supplied by Microdop GmbH).

Printing was carried out by means of the ink jet printer on a glass substrate covered with a layer of indium-tin oxide (ITO) and further provided with a relief pattern of lines and cavities. Said relief pattern was formed through the application, exposure, and development of a photoresist such as the AZ 4562 photoresist from Hoechst. The distance between the substrate and the nozzle of the ink jet head was set for 1.0 mm, while the ink jet head was moved parallel to the lines of the relief pattern and was positioned above the center of a depression to be filled between the lines. The initial average height of a liquid layer deposited by the ink jet head $h_{ini}$ was equal to f.V/U.B, in which f is the ink jet droplet frequency, V is the droplet volume, U is the velocity of passage of the substrate with respect to the ink jet head, and B is the width of the depression between the lines. In a first example of printing of the NRS—PPV solution, f, V, U, and B were set as follows: f=300 Hz, V=220 pl, U=0.03 m/s, and B=260 μm, which resulted in a hini value of 8.5 μm. It was subsequently tested whether the composition could be printed.

The result is given in Table 1. Not printable means therein that no stable formation of droplets was possible. The printer head formed threads, e.g. droplets with filaments. These filaments broke up into undesirable small satellite droplets and may thus strongly interfere with the landing position of the droplet. As the ratio $M_n/M_w$ increased, the length of the filament increased. The influence of the high $M_w$ was so strong in some cases that no drop emerged from the printing head at all.

TABLE 1 printing quality of compositions after an ultrasonic treatment, soft US and harsh US denoting the types of ultrasonic treatment as discussed in embodiments 1 and 2, defined in hours, while the molecular weights $M_w$ and $M_n$ are given in g/mole.

| No. | Solvent | Concentration [g/l] | Viscosity 40s-1 | Viscosity 500s-1 | Soft US [h] | Harsh US [h] | $M_w/10^3$ | $M_n/10^3$ | Printing Quality |
|---|---|---|---|---|---|---|---|---|---|
| 1 | tetraline | 8.81 | 11.6 | 11.0 | 21 | 10 | 170 | 90 | Good |
| 2 | phenetole | 9.92 | 7.5 | 7.1 | 22 | 20 | 190 | 110 | Good |
| 3 | 4-methyl-anisole | 9.24 | 10.9 | 8.5 | 14.5 | 12 | 250 | 130 | Good |
| 4 | anisole | 7.56 | 8.4 | 6.8 | 23 | 0 | 370 | 150 | Good |
| 5 | anisole | 11.47 | 12.4 | 9.3 | 29 | 7.5 | 265 | 150 | Good |
| 6 | anisole | 8.86 | 8.5 | 7.7 | 7 | 13 | 310 | 170 | Good |
| 7 | 4-methylanisole/o-xylene 3:1 | 8.40 | 8.7 | 8.2 | 16 | 12 | 350 | 170 | Good |
| 8 | anisole | 8.80 | 11.3 | 9.6 | 32 | 0 | 400 | 180 | Good |
| 9 | o-xylene | 7.93 | 9.5 | 8.3 | 22 | 13 | 390 | 180 | Good |
| 10 | anisole/o-xylene 1:1 | 11.7 | 13 | 12.5 | 23 | 24.5 | 380 | 190 | Good |
| 11 | anisole/o-xylene 1:1 | 8.1 | 8.8 | 8.6 | 9.5 | 12 | 400 | 190 | Good |
| 12 | o-xylene | 7.81 | 9.4 | 9.6 | 16.5 | 20 | 400 | 200 | Good |
| 13 | anisole/o-xylene | 8.89 | 9.3 | 9.3 | 15 | 10 | 450 | 210 | Good |
| 14 | o-xylene/anisole | 8.98 | 11.9 | 11.4 | 13.5 | 30 | 440 | 215 | good |
| 15 | toluene | 7.81 | 8.7 | 8.1 | 21 | 0 | 490 | 220 | Reasonable |
| 16 | toluene | 5.99 | 6.5 | 6.1 | 4 | 0 | 600 | 230 | Reasonable |
| 17 | o-xylene | 9.00 | 17.3 | 16.3 | 52 | 0 | 520 | 240 | Moderate |
| 18 | anisole/o-xylene 3:1 | 8.29 | 13.3 | 12.0 | 20 | 0 | 500 | 250 | Not printable |
| 19 | anisole/o-xylene 1:1 | 8.89 | 23.4 | 19.1 | 9.5 | 0 | 690 | 290 | Not printable |
| 20 | toluene | 6.72 | 14.7 |  | 4 | 0 | 880 | 310 | Not printable |
| 21 | toluene | 6.75 | 18.1 |  | 3 | 0 | 980 | 320 | Not printable |
| 22 | toluene | 5.99 | 7.60 | 7.12 | 2 | 0 | 890 | 390 | Moderate |
| 23 | toluene | 6.85 | 16.1 |  | 2 | 0 | 840 | 400 | Not printable |
| 24 | toluene | 6.52 | 25.2 |  | 1 | 0 | 1100 | 420 | Not printable |
| 25 | anisole | 4.3 | 11.0 | 11.7 | 0 | 0 | 530 | 450 | Not printable |

EMBODIMENT 4

Of the above experiments, those numbered 11, 13, and 19 were repeated, a multinozzle ceramic printing head with 64 nozzles being used for printing, each nozzle having a diameter of 50 μm. The results were found to be unchanged.

EMBODIMENT 5

FIG. 1 diagrammatically and in cross-section shows a first embodiment of the electronic device 10. This device 10 comprises a substrate 11, a first electrode layer 12, a first relief structure 13, a hole injection layer 14, an electroluminescent layer 15, and a second electrode layer 16. The substrate 11 comprises soda lime glass with a thickness of 1.1 mm. The first electrode layer 12 of ITO is provided in a conventional manner on the substrate 11 in a pattern of 280 μm wide lines and 30 μm wide openings. The first electrodes are thus obtained in the form of row electrodes. These row electrodes act as the anodes of the electroluminescent elements 1.

The substrate is subsequently covered with a layer of a negative photoresist AZ5218-e (AZ Hoechst) by means of spin coating (1000 rpm). The photoresist is irradiated in a pattern by means of a mask. The photoresist has a pattern of lines and openings of 20 and 290 μm, respectively, which pattern is at right angles to the row electrodes in the vicinity (40 μm interspacing). A dose of 230 mJ/cm² is used for the exposure. Then the photoresist is cured at 110° C. for 10 minutes and exposed without a mask to a dose of 400 mJ/cm², whereupon the photoresist is developed through the use of a 1:1 AZ developer: DI water developer during a period sufficient for obtaining a negative angle of 45°. Then the entire assembly is given an aftertreatment at 100° C. for 15 minutes. The result is a relief structure 13 of lines and openings, with a line width of 30 μm and openings of 280 μm. The openings are situated above the first electrodes in this case. Each line has the shape of an upside-down trapezium, measuring 30 μm at the top and 20 μm at the base. The height of the relief structure 13 is 5.0 μm.

A solution of poly-3,4-ethylenedioxythiophene (PEDOT) and polystyrenesulphonic acid in water with a 3% solids content is provided over the relief pattern by means of spin coating at 2000 rpm. This results in a wet layer with an average thickness of 8.3 μm. During spincoating, the wet layer is dried at 130° C. for 3 minutes. This results in a patterned hole injection layer 14 of PEDOT with a thickness of 250 nm and a square resistance of 100 MΩ/square.

Subsequently a solution of 0.6% by weight of the ultrasonically treated NRS—PPV is provided by means of ink jet printing as described in embodiment 3. The electroluminescent layer 15 is formed by the ink jet printing process.

Then a 3 nm thick layer of Ba and a 200 nm thick layer of Al is deposited, together forming the second electrode layer 16, on the electroluminescent layer 15. During this deposition, the relief structure 13 serves as a shadow mask. The second electrode layer 15 forms a plurality of column electrodes (cathodes).

The electroluminescent device 10 thus obtained is packed in an envelope which is sealed off by means of an epoxy glue. A quantity of BaO is present in the envelope so as to act as a water getter.

EMBODIMENT 6

Embodiment 5 is repeated, an ultrasonically treated solution of the NRS/PPV having formula (1) being printed in a first, third, and fifth cavity. Subsequently an ultrasonically treated solution of the PPV having formula (2) is printed in a second, fourth, and sixth cavity. The cavities in this case have dimensions of 60 by 60 µm. The result is a two-color device, the first, third, and fifth cavities emitting yellow light during operation ($\lambda$=590 nm), and the second, fourth, and sixth cavities emitting green light during operation ($\lambda$=550 nm). Alternative embodiments printing in three or more colors are also possible on the basis of this principle. It is furthermore possible that not only PPVs, but also other electroluminescent polymers such as polyfluorines are used.

The invention claimed is:

1. A polymer with structural units in accordance with formula I,

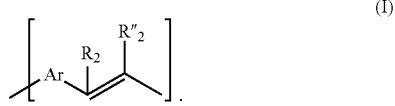

in which
Ar is an aromatic cyclic system with 4 to 20 carbon atoms with optionally a single or multiple substitution with a group consisting of a non-branched $C_1$–$C_{20}$-alkyl, $C_3$–$C_{20}$-alkoxy, $C_1$–$C_{20}$-alkylsulphate, a branched $C_3$–$C_{20}$-alkyl, phenyl, or benzyl group, and which may optionally comprise up to 4 hetero atoms selected from the group consisting of oxygen, sulfur, and nitrogen in the aromatic cyclic system,
$R_2$ and $R''_2$ are selected from a the group consisting of a $C_1$–$C_{20}$-alkyl and a $C_4$–$C_{20}$-aryl group, which groups may optionally comprise substituents,
characterized in that the polymer has a number average molecular weight which is below $300\times10^3$ g/mole, and in that the polymer has a weight average molecular weight which is below $500\times10^3$ g/mole.

2. A polymer as claimed in claim 1, characterized in that the number average molecular weight lies between $75\times10^3$ and $225\times10^3$ g/mole, and in that the weight average molecular weight lies between $150\times10^3$ and $450\times10^3$ g/mole.

3. A polymer as claimed in claim 1, characterized in that Ar— in formula (1) stands for

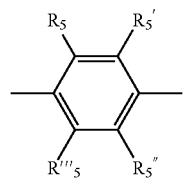

in which $R_5$, $R'_5$, $R''_5$, and $R'''_5$ are selected from the group consisting of the atoms of hydrogen, chlorine, bromine, fluorine, and iodine, and the $C_1$–$C_4$-alkyl, carbonitryl, trihalomethyl, hydroxy, nitro, amino, carboxyl, sulphoxyl, sulphonate, and carbonate groups, and optionally substituted phenyl, alkylaryl, and arylalkyl, alkoxy, and thioalkoxy groups.

4. A polymer as claimed in claim 1, characterized in that the polymer is obtained through:
preparation of the polymer having structural units in accordance with formula I from a polymer having structural units in accordance with formula II, in which Z is a halogen selected from the group consisting of F, Cl, Br, and I; and subsequently
an ultrasonic after treatment of a composition comprising the prepared polymer and a solvent.

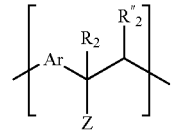

5. A composition comprising a solvent and a polymer as claimed in claim 1.

6. A composition as claimed in claim 5, characterized in that the polymer is present in a concentration of between 0.5 and 2.0% by weight, wherein the number average molecular weight of the polymer is greater than $75\times10^3$ g/mole and the weight average molecular weight of the polymer is greater than $150\times10^3$ g/mole.

7. A method of preparing a polymer defined by formula I, the method Comprising the steps of: preparing the polymer with a number average molecular weight of more than $75\times10^3$ g/mole, and
subjecting the polymer to an ultrasonic aftertreatment in which the number average molecular weight drops to below $300\times10^3$ g/mole, and the polymer weight average molecular weight is below $500\times10^3$ g/mole.

8. The method of claim 7, further comprising the step of ink jet printing a layer of the polymer on a substrate.

9. An electronic device provided with a patterned layer comprising a polymer with structural units of the formula I on a substrate,

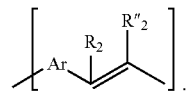

in which
Ar is an aromatic cyclic system with 4 to 20 carbon atoms with optionally a single or multiple substitution with a group consisting of a non-branched $C_1$–$C_{20}$-alkyl, $C_3$–$C_{20}$-alkoxy, $C_1$–$C_{20}$-alkylsulphate, a branched $C_1$–$C_{20}$-alkyl, phenyl, or benzyl group, and which may optionally Comprise up to 4 hetero atoms chosen from the group Comprising oxygen, sulfur, and nitrogen in the aromatic cyclic system,
$R_2$ and $R''_2$ are selected from the group consisting of a $C_1$–$C_{20}$-alkyl and a $C_4$–$C_{20}$-aryl group, which groups may optionally comprise substituents, characterized in that the polymer has a number average molecular weight which is below $300\times10^3$ g/mole, and in that the polymer has a weight average molecular weight which is below $500\times10^3$ g/mole.

10. An electronic device as claimed in claim 9, in which —Ar— represents:

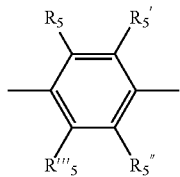

in which $R_5$, $R'_5$, $R''_5$, and $R'''_5$ selected from the group consisting of the atoms of hydrogen, chlorine, bromine, fluorine, and iodine, and the $C_1$–$C_4$-alkyl, carbonitryl, trihalomethyl, hydroxy, nitro, amino, carboxyl, sulphoxyl, sulphonate, and carbonate groups, and optionally substituted phenyl, alkylaryl and arylalkyl, alkoxy, and thioalkoxy groups.

11. An electronic device as claimed in claim 10, characterized in that a second patterned layer is present on the substrate in addition to the—first—patterned layer, which second layer comprises a different eletroluminescentmaterial than the first layer and is provided by means of ink jet printing, and the device comprises a first and a second electroluminescent element, the first element comprising the first patterned layer and emitting light of a first wavelength during operation, and the second element comprising the second patterned layer and emitting light of a second wavelength during operation.

* * * * *